United States Patent
Tamura

(10) Patent No.: US 11,386,971 B2
(45) Date of Patent: Jul. 12, 2022

(54) SEMICONDUCTOR STORAGE DEVICE AND CONTROL METHOD OF SEMICONDUCTOR STORAGE DEVICE

(71) Applicants: Kabushiki Kaisha Toshiba, Tokyo (JP); Toshiba Electronic Devices & Storage Corporation, Tokyo (JP)

(72) Inventor: Motoki Tamura, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/012,118

(22) Filed: Sep. 4, 2020

(65) Prior Publication Data
US 2021/0295935 A1    Sep. 23, 2021

(30) Foreign Application Priority Data
Mar. 23, 2020  (JP) .............................. JP2020-051578

(51) Int. Cl.
*G11C 17/00* (2006.01)
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ................................ G11C 17/18; G11C 17/16

USPC ............................................................ 365/96
See application file for complete search history.

(56) References Cited

U.S. PATENT DOCUMENTS

| | | | |
|---|---|---|---|
| 7,046,569 B2 | 5/2006 | Ito et al. | |
| 7,402,855 B2 | 7/2008 | Kurjanowicz | |
| 8,922,472 B2 | 12/2014 | Yamamoto et al. | |
| 9,391,622 B2 | 7/2016 | Tamura et al. | |
| 9,735,682 B1 | 8/2017 | Tamura | |
| 10,090,309 B1 | 10/2018 | Chen et al. | |
| 2001/0017546 A1* | 8/2001 | Oh | G11C 17/18 324/550 |
| 2007/0076463 A1* | 4/2007 | Keshavarzi | G11C 17/165 365/96 |
| 2010/0195416 A1* | 8/2010 | Akamatsu | G11C 7/222 365/189.11 |

FOREIGN PATENT DOCUMENTS

| | | | |
|---|---|---|---|
| JP | 2005-276907 A | 10/2005 | |
| JP | 2005-302091 A | 10/2005 | |

(Continued)

*Primary Examiner* — Huan Hoang
(74) *Attorney, Agent, or Firm* — Allen & Overy LLP

(57) ABSTRACT

A semiconductor storage device according to the present embodiment includes an antifuse element and a first element. The antifuse element is connected at one end to a first terminal to which a write voltage is applicable, and includes a gate oxide film. The first element is connected to the other end of the antifuse element. In a case where the write voltage that breaks the gate oxide film is supplied to the first terminal and the gate oxide film is not broken, the first element supplies a second potential that makes a potential difference between the one end and the other end less than a potential that breaks the gate oxide film, to the other end.

17 Claims, 13 Drawing Sheets

(56) References Cited

FOREIGN PATENT DOCUMENTS

| | | |
|---|---|---|
| JP | 2010-529685 A | 8/2010 |
| JP | 2013-106121 A | 5/2013 |
| JP | 2015-149694 A | 8/2015 |
| JP | 2017-169322 A | 9/2017 |
| JP | 2018-186256 A | 11/2018 |
| JP | 6505624 B2 | 4/2019 |

* cited by examiner

| PRG mode | PRG1 | DCp | state | VBP | VBT | PRG2_X | N1 | N0 | S/A out |
|---|---|---|---|---|---|---|---|---|---|
| VDD | VDD | 0V | Program STATE, Cell WRITING | 3x VDD | VDD | VDD | 0V | 0V | 0V |
| VDD | 0V | 0V | Program STATE, Cell NOT WRITING | 3x VDD | VDD | 2x VDD | floating | floating | X |
| 0V | 0V | VDD | Read STANDBY STATE, discharge | VDD | VDD | VDD | X or 0V | 0V | 0V |
| 0V | 0V | 0V | Read STATE, WHEN WRITTEN cell HAS BEEN READ | VDD | VDD | VDD | VDD | VDD−2xVth | VDD |
| 0V | 0V | 0V | Read STATE, WHEN UNWRITTEN cell HAS BEEN READ | VDD | VDD | VDD | 0V | 0V | 0V |

FIG. 3

| PRG mode | N2 | VBP |
|---|---|---|
| VDD | 2x VDD | 3x VDD |
| 0V | VDD | VDD |

| PRG mode | PRG1 | PRG2_X |
|---|---|---|
| VDD | VDD | VDD |
| VDD | 0V | 2x VDD |
| 0V | 0V | VDD |

| PRG mode | PRG1 | DCp | state | VBP | VBT | N1 | N0 | S/A out |
|---|---|---|---|---|---|---|---|---|
| VDD | VDD | VDD | Program STATE, Cell WRITING | 3x VDD | VDD | 0V | 0V | 0V |
| VDD | 0V | 0V | Program STATE, Cell NOT WRITING | 3x VDD | VDD | 2x VDD | VDD-Vth | VDD |
| 0V | VDD | VDD | Read STANDBY STATE, discharge | VDD | VDD | X or 0V | 0V | 0V |
| 0V | VDD | 0V | Read STATE, WHEN WRITTEN cell HAS BEEN READ | VDD | VDD | VDD | VDD-Vth | VDD |
| 0V | VDD | 0V | Read STATE, WHEN UNWRITTEN cell HAS BEEN READ | VDD | VDD | 0V | 0V | 0V |

FIG. 12

| PRG mode | PRG1 | LSout |
|---|---|---|
| VDD | VDD | 0V |
| VDD | 0V | 2x VDD |
| 0V | VDD | Hi-Z (ALLOW 0 V TO VDD) |
| 0V | 0V | PROHIBIT |

FIG. 13

| IN | OUT1 |
|---|---|
| 2x VDD | 2x VDD |
| 0V | VDD |
FIG. 16
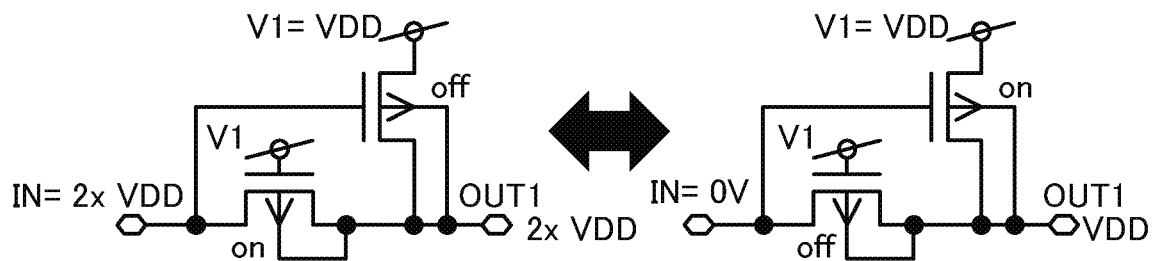
FIG. 17
| IN | OUT0 |
|---|---|
| 2x VDD | VDD |
| 0V | 0V |
FIG. 18
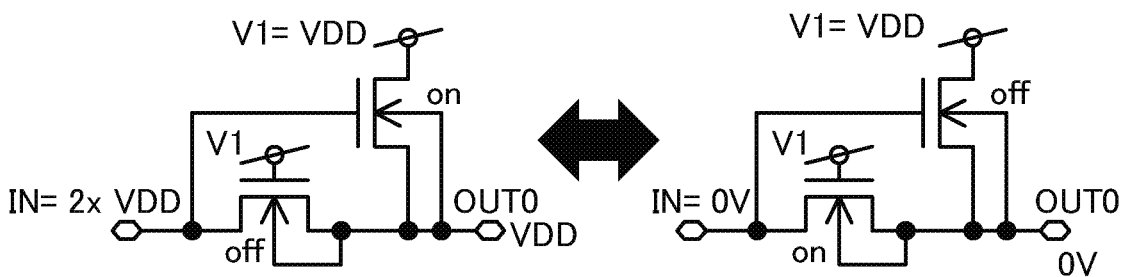
FIG. 19

SEMICONDUCTOR STORAGE DEVICE AND CONTROL METHOD OF SEMICONDUCTOR STORAGE DEVICE

CROSS-REFERENCE TO RELATED APPLICATIONS

This application is based upon and claims the benefit of priority from the prior Japanese Patent Application No. 2020-051578, filed on Mar. 23, 2020, the entire contents of which are incorporated herein by reference.

FIELD

Embodiments of the present invention relate to a semiconductor storage device and a control method of a semiconductor storage device.

BACKGROUND

An antifuse element basically has an equivalent configuration to a capacitor. This antifuse element is open between both terminals thereof when no data is written. When data has been written, a dielectric layer of a capacitor is short-circuited, so that both the terminals are short-circuited to each other. By using this antifuse element, it is possible to further downsize a semiconductor storage device. However, because of coupling action by the antifuse element having a capacitor structure, a high voltage is applied to a transistor connected to the antifuse element, and therefore a high breakdown-voltage transistor is required.

BRIEF DESCRIPTION OF THE DRAWINGS

FIG. 3 is a diagram illustrating a relation between a voltage applied to the antifuse memory circuit and respective modes;

FIG. 12 is a diagram illustrating a relation between a voltage applied to the antifuse memory circuit and respective modes according to the second embodiment;

FIG. 13 is a diagram illustrating truth values of the level shifter circuit;

FIG. 16 is a diagram illustrating truth values of a level-down circuit configured by a PMOS transistor;

FIG. 17 is a diagram illustrating a configuration example and an operation example of the level-down circuit configured by the PMOS transistor;

FIG. 18 is a diagram illustrating truth values of a level-down circuit configured by an NMOS transistor; and FIG. 19 is a diagram illustrating a configuration example and an operation example of the level-down circuit configured by the NMOS transistor.

DETAILED DESCRIPTION

Figure 1:
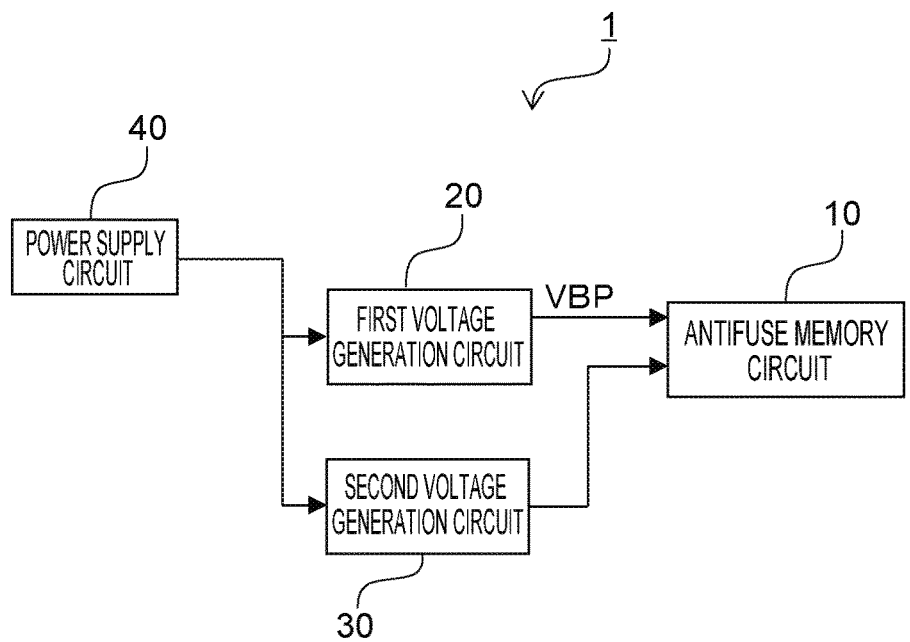
FIG. 1 is a block diagram of a semiconductor storage device.

A semiconductor storage device and a control method of a semiconductor storage device according to embodiments of the present invention will now be explained in detail with reference to the accompanying drawings. The embodiments described below are only examples of the embodiments of the present invention and it is not to be understood that the present invention is limited to these embodiments. In the drawings referred to in the embodiments, same parts or parts having identical functions are denoted by like or similar reference characters and there is a case where redundant explanations thereof are omitted. Further, for convenience of explanation, there are cases where dimensional ratios of the parts in the drawings are different from those of actual products and some part of configurations is omitted from the drawings.

First Embodiment

FIG. 1 is a block diagram of a semiconductor storage device 1. As illustrated in FIG. 1, the semiconductor storage device 1 is a device that allows data writing into an antifuse element, and includes an antifuse memory circuit 10, a first voltage generation circuit 20, a second voltage generation circuit 30, and a power supply circuit 40. The semiconductor storage device 1 can employ a commonly used silicon process that forms a configuration in which a Deep N-well is placed on a silicon substrate (a P-substrate), a P-well is formed in the Deep N-well, and an NMOS transistor is arranged in the P-well, or can employ a configuration of arrangement on an SOI (Silicon On Insulator) substrate, for example.

The antifuse memory circuit 10 includes a plurality of antifuse elements. Each antifuse element has a gate oxide film. The antifuse element has a capacitor structure and is open between its two terminals before writing. When a high voltage is applied across the two terminals by writing and the gate oxide film is broken, the two terminals are short-circuited to each other. Details of the antifuse memory circuit 10 will be described later. Although one of the antifuse elements is described in the present embodiment, the other antifuse elements also have an identical configuration to the one antifuse element.

The first voltage generation circuit 20 generates, for example, on the basis of a first voltage V1, a second voltage V2, and a third voltage V3 supplied from the power supply circuit 40, a fourth voltage VBP to be supplied to the antifuse memory circuit 10. The present embodiment describes the first voltage V1 as VDD, the second voltage V2 as 2×VDD, and the third voltage V3 as 3×VDD. Further, V0 is assumed as a reference potential, and is also assumed to be 0 V for simplifying descriptions.

The second voltage generation circuit 30 generates, for example, on the basis of the first voltage V1 and the second voltage V2 supplied from the power supply circuit 40, a gate voltage PRG2_X to be supplied to the antifuse memory circuit 10. Details of the first voltage generation circuit 20 and the second voltage generation circuit 30 will be also described later.

The power supply circuit 40 supplies, for example, the first voltage V1, the second voltage V2, and the third voltage V3 to the first voltage generation circuit 20. The power supply circuit 40 also supplies, for example, the first voltage V1 and the second voltage V2 to the second voltage generation circuit 30. Details of the power supply circuit 40 will be also described later.

Figure 2:
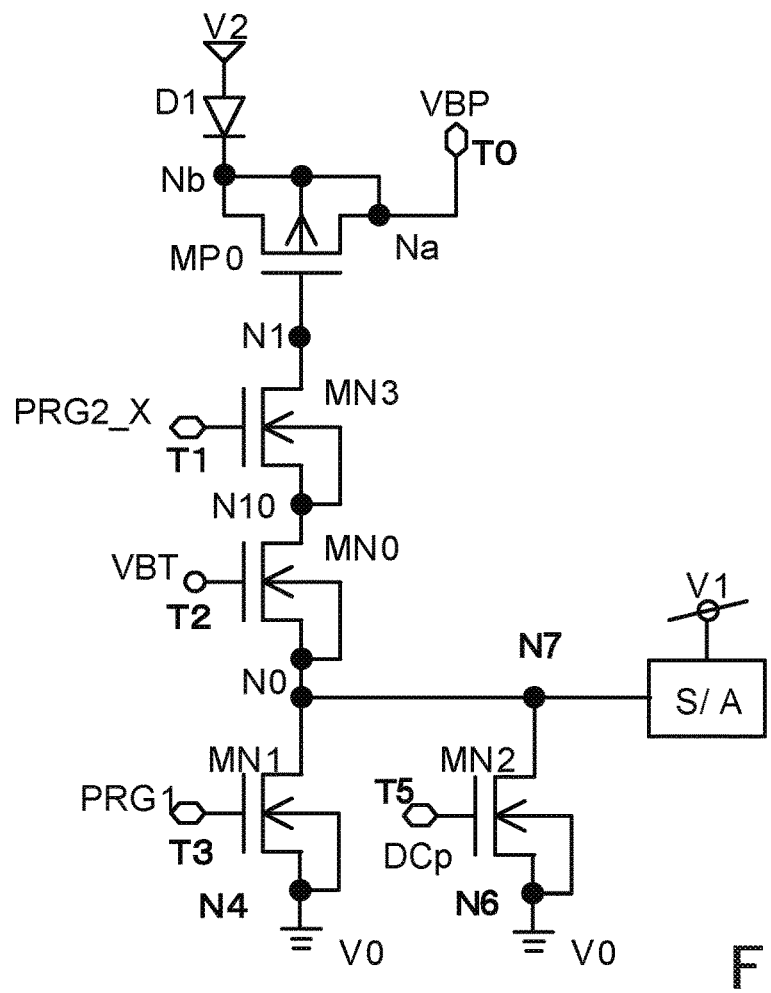
FIG. 2 is a diagram illustrating a configuration example of an antifuse memory circuit.

FIG. 2 is a diagram illustrating a configuration example of the antifuse memory circuit 10. FIG. 3 is a table representing a relation between a voltage to be applied to the antifuse memory circuit 10 and each mode. The antifuse memory circuit 10 includes an antifuse element MP0, transistors MN3, MN0, MN1, and MN2, and a sense amplifier S/A. For example, it is assumed in the present embodiment that a breakdown voltage of each of the transistors MN3, MN0, MN1, and MN2 is VDD+2×threshold voltage Vth.

As illustrated in FIG. 2, the antifuse element MP0 (Cell) is configured by connecting source and drain terminals of a PMOS transistor, for example. The voltage VBP can be applied to a node Na to which the source and drain terminals are connected, via a terminal T0. The second voltage V2 can be applied to a node Nb via a diode D1.

The transistors MN3, MN0, and MN1 are connected in series to each other between a gate terminal of the antifuse element MP0 and the reference potential V0. The transistor MN3 is, for example, an NMOS transistor, and its source and drain are connected to nodes N1 and N10, respectively. The voltage PRG2_X can be applied to a gate of the transistor MN3 via a terminal T1.

The transistor MN0 is, for example, an NMOS transistor, and its source and drain are connected to the node N10 and a node N0, respectively. A voltage VBT can be applied to a gate of the transistor MN0 via a terminal T2.

The transistor MN1 is, for example, an NMOS transistor, and its source and drain are connected to the node N10 and a node N4 that is at the reference potential V0, respectively. A voltage PRG1 can be applied to a gate of the transistor MN1 via a terminal T3.

The sense amplifier S/A and a source of the transistor MN2 are connected to the node N0 to which the drain of the transistor MN0 and the source of the transistor MN1 are connected, via a node N7.

The transistor MN2 is, for example, an NMOS transistor, and its drain is connected to the reference potential V0 via a node N6. A voltage DCp can be applied to a gate of the transistor MN2 via a terminal T5.

In FIG. 3, PRGmode represents a voltage to be applied to input terminals of the first voltage generation circuit 20 and the second voltage generation circuit 30 described later. PRG1 represents the voltage PRG1 to be applied to the terminal T3. DCp represents the voltage DCp to be applied to the terminal T5, and state represents the state of the antifuse memory circuit 10. Further, the voltage VBP to be applied to the terminal T0 is represented by VBP, the voltage VBT to be applied to the terminal T2 is represented by VBT, and the voltage PRG2_X to be applied to the terminal T1 is represented by PRG2_X. Further, N1 represents a voltage of the node N1, N0 represents a voltage of the node N0, and S/Aout represents output of the sense amplifier S/A.

First, in cell writing in a program state of the antifuse memory circuit 10, the voltage VBP to be applied to the terminal T0 is 3×VDD, and the voltages PRG2_X, VBT, and PRG1 to be respectively applied to the terminals T1, T2, and T3 are VDD. Further, the voltage to be applied to the terminal T5 is 0 V. Thus, the transistors MN3, MN0, and MN1 become a conductive state, and the transistor MN2 becomes a non-conductive state. Therefore, the node N1 is placed at the reference potential V0. Accordingly, the voltage between the terminal T0 and the node N1 becomes 3×VDD, so that a gate oxide film of the antifuse element MP0 is broken. Also, gate, source, drain, and back gate of the antifuse element MP0 become a conductive state with each other.

On the other hand, in order to prevent the gate oxide film from being broken, it is necessary to suppress the voltage between the terminal T0 and the node N1 within VDD+threshold voltage Vth, for example. In other words, a design value when writing is not performed is set to suppress the voltage between the terminal T0 and the node N1 within VDD+threshold voltage Vth. Further, the node N1 becomes a high voltage that is close to the voltage VBP because of coupling between the voltage VBP and the antifuse element MP0. That is, in a case where the voltage VBP is 3×VDD, the node N1 may become a high voltage that is close to 3×VDD.

In other words, when writing is not performed, the gate oxide film of the antifuse element MP0 is not broken unless the potential of the node N1 is caused to fall below (2×VDD)-Vth. That is, by setting the voltage PRG2_X to 2×VDD, it is possible to suppress the potential of the node N1 not to rise above (2×VDD)+threshold voltage Vth. Therefore, in the present embodiment, when writing is not performed, the voltage PRG2_X=2×VDD, which makes the potential difference between the terminal T0 and the node N1 less than a potential that breaks the gate oxide film, is applied to the gate of the transistor MN3 connected to the node N1. Accordingly, the gate oxide film is prevented from being broken when writing is not performed.

Further, back gates of the transistors MN3 and MN0 are open, and the voltages of the nodes N1 and N0 are floating.

Therefore, a potential difference between the nodes N1 and N0 is divided by the transistors MN3 and MN0. Accordingly, a voltage from 0 to VDD is applied to the node N0, a voltage from VDD to 2VDD is applied to the node N10, a voltage from 2VDD to 3VDD is applied to the node N1, and each of the transistors MN3, MN0, and MN1 can be configured by a transistor with a low breakdown voltage within VDD+2×threshold voltage Vth.

Next, in reading (Read), the voltage VBP to be applied to the terminal T0 is VDD, and the voltages PRG2_X, VBT, and PRG1 to be applied to the terminals T1, T2, and T3 are VDD, VDD, and 0 V, respectively. Further, the voltage to be applied to the terminal T5 is VDD. That is, before reading (Read), the voltage DCp is set to VDD to make the potential of the node N0 sufficiently close to V0. After a predetermined time passes, the potential of the node N0 is detected by the sense amplifier S/A. If writing has been already performed for the antifuse element MP0, the gate oxide film thereof has been already broken and therefore has become a conductive state. Thus, a voltage reduced from the voltage VBP that is the voltage VDD by the threshold voltage Vth is measured. Meanwhile, if writing has not been performed for the antifuse element MP0, the gate oxide film thereof is a non-conductive state. Thus, a voltage of 0 V is measured.

A detailed configuration of the first voltage generation circuit 20 is described with reference to FIGS. 4 to 7. FIG.

Figure 4:
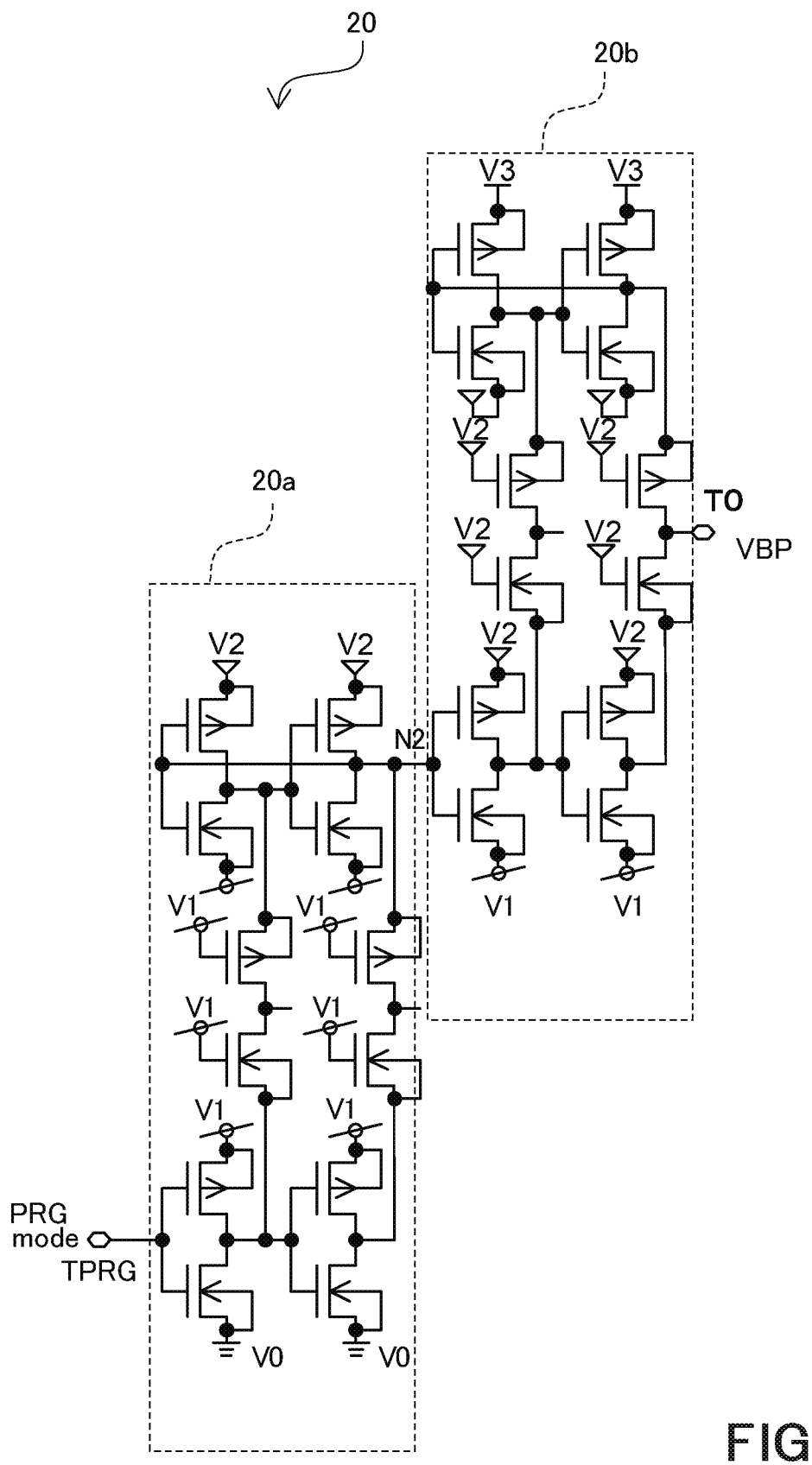
FIG. 4 is a circuit diagram illustrating a detailed configuration example of a first voltage generation circuit.

4 is a circuit diagram illustrating a detailed configuration example of the first voltage generation circuit 20. As illustrated in FIG. 4, the first voltage generation circuit 20 includes a level shifter circuit 20a and a level shifter circuit 20b. As illustrated in FIG. 4, the level shifter circuit 20a and the level shifter circuit 20b form a two-stage configuration. The voltage PRGmode is supplied to a terminal TPRG.

Figure 5:
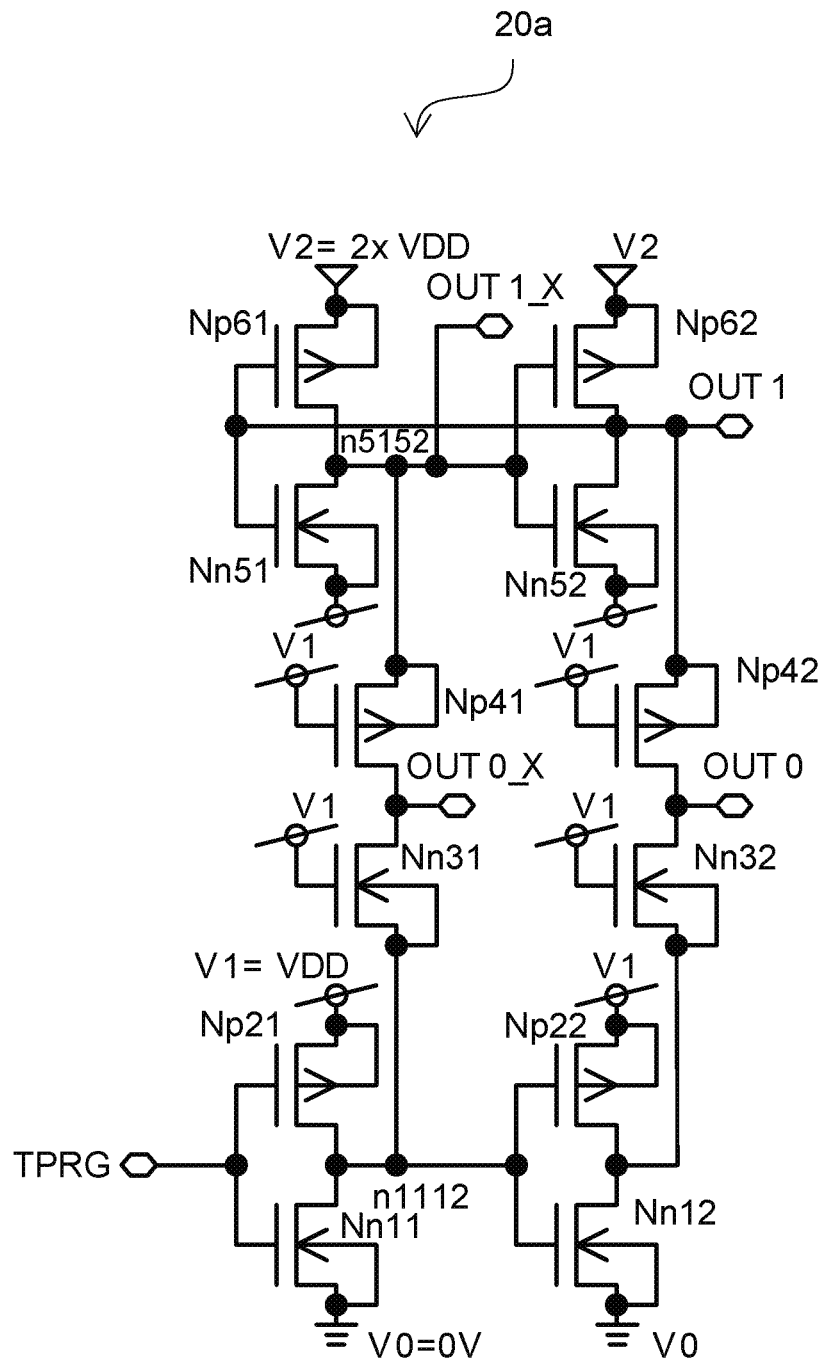
FIG. 5 is a diagram illustrating a configuration example of a level shifter circuit.

FIG. 5 is a diagram illustrating a configuration example of the level shifter circuit 20a. As illustrated in FIG. 5, the level shifter circuit 20a includes NMOS transistors Nn11, Nn12, Nn31, Nn32, Nn51, and Nn52 and PMOS transistors Np21, Np22, Np41, Np42, Np61, and Np62. The transistor Nn11 and the transistor Np21 are cascade-connected to each other, the transistor Nn31 and the transistor Np41 are cascade-connected to each other, the transistor Nn51 and the transistor Np61 are cascade-connected to each other, the transistor Nn12 and the transistor Np22 are cascade-connected to each other, the transistor Nn32 and the transistor Np42 are cascade-connected to each other, and the transistor Nn52 and the transistor Np62 are cascade-connected to each other.

A connection node n1122 between a drain of the transistor Nn11 and a source of the transistor Np21 is connected to gates of the transistor Nn12 and the transistor Np22. Further, the connection node n1122 is connected to a drain of the transistor Nn31. A source of the transistor Np41 is connected to a node n5152. The connection node n5152 between a drain of the transistor Np61 and a source of the transistor Nn51 is connected to gates of the transistor Np62 and the transistor Nn52. A connecting portion between a gate of the transistor Nn11 and a gate of the transistor Np21 is the terminal TPRG, and the voltage PRGmode is applied thereto. An output terminal OUT1 is connected to a connecting portion between a drain of the transistor Np62 and a source of the transistor Nn52.

Figure 6:
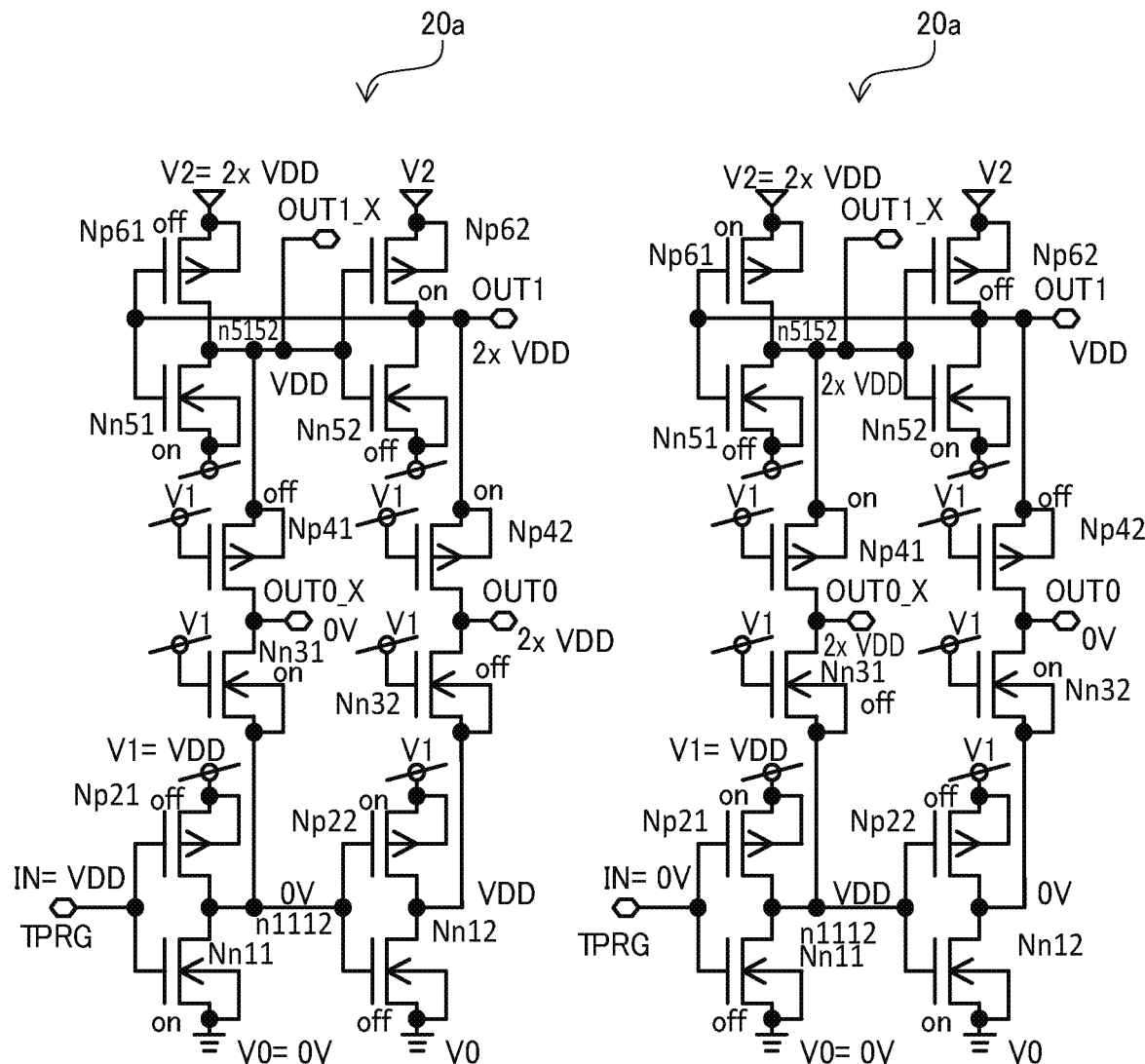
FIG. 6 is an explanatory diagram of operation examples of the level shifter circuit.

FIG. 6 is an explanatory diagram of operation examples of the level shifter circuit 20a. The left half illustrates an operation example when the voltage VDD is applied to the terminal TPRG, and the right half illustrates an operation example when 0 V is applied to the terminal TPRG.

First, when the voltage VDD is applied to the terminal TPRG, the transistors Nn11, Nn31, Nn51, Np22, Np42, and Np62 become a conductive state, and the rest of the transistors become a non-conductive state. Accordingly, a terminal OUT0_X becomes 0 V and a terminal OUT0 becomes 2×VDD. Further, a terminal OUT1_X becomes VDD and a terminal OUT1 becomes 2×VDD.

Next, when the reference potential V0 (0 V) is applied to the terminal TPRG, the transistors Nn11, Nn31, Nn51, Np22, Np42, and Np62 become a non-conductive state, and the rest of the transistors become a conductive state. Accordingly, the terminal OUT0_X becomes 2×VDD and the terminal OUT0 becomes 0 V. Further, the terminal OUT1_X becomes 2×VDD and the terminal OUT1 becomes VDD.

Referring back to FIG. 4, the level shifter circuit 20b has an equivalent configuration to the level shifter circuit 20a. Therefore, a voltage input via a node N2 is 2×VDD or VDD. That is, the terminal T0 becomes 3×VDD when the voltage VDD is applied to the terminal TPRG, and becomes VDD when 0 V is applied to the terminal TPRG.

Figures 7, 8:
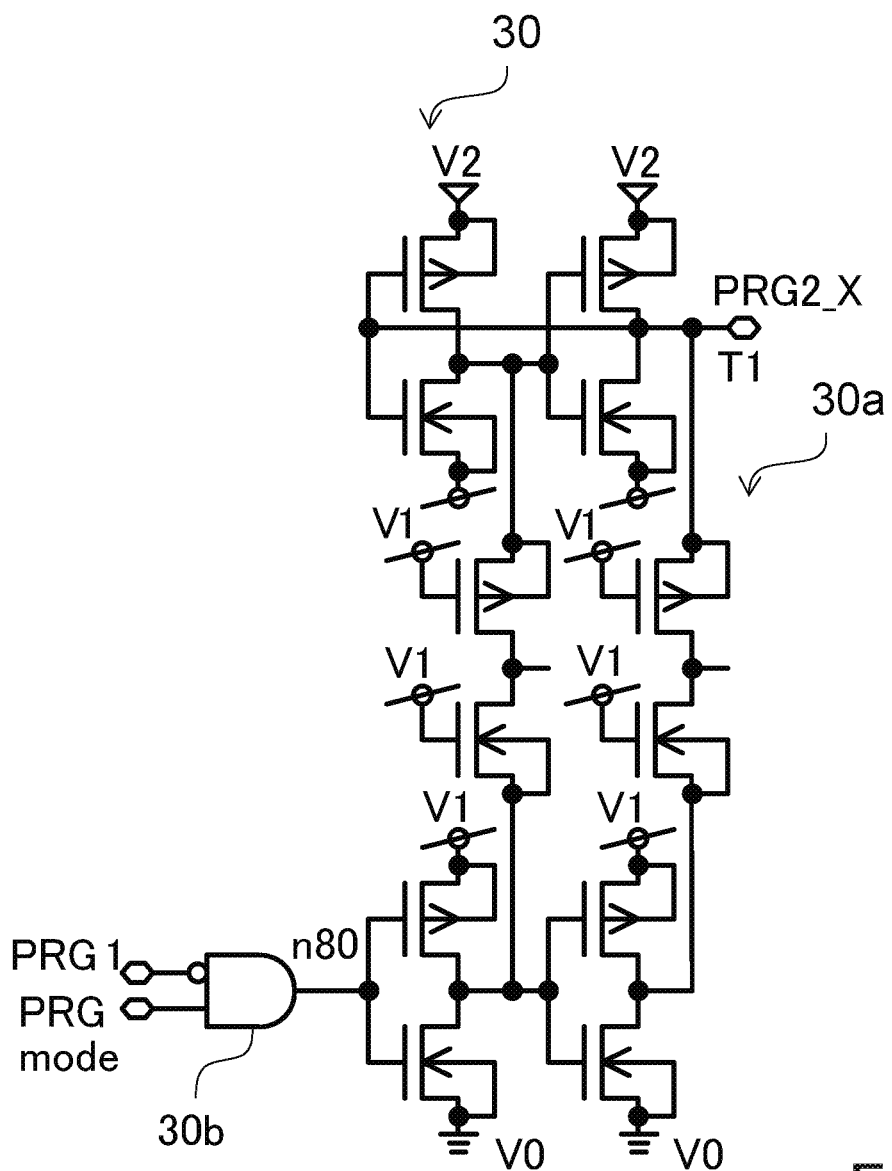
FIG. 7 is a diagram illustrating truth values of a first voltage generation circuit.
FIG. 8 is a diagram illustrating a configuration example of a second voltage generation circuit.

FIG. 7 is a truth table of the first voltage generation circuit 20. The voltage PRGmode represents a voltage to be applied to the terminal TPRG, N2 represents the voltage of the node N2, and VBP represents the voltage of the terminal T0. As shown in the table, the first voltage generation circuit 20 outputs 3×VDD to the terminal T0 when the voltage PRGmode is VDD, and outputs VDD to the terminal T0 when the voltage PRGmode is 0 V. Accordingly, it is possible to supply VDD or 3×VDD to the terminal T0 illustrated in FIG. 2 as the voltage VBP.

FIG. 8 is a diagram illustrating a configuration example of the second voltage generation circuit 30. As illustrated in FIG. 8, the second voltage generation circuit 30 includes a level shifter circuit 30a and an AND circuit 30b. The level shifter circuit 30a has an equivalent configuration to the level shifter circuit 20a, and the AND circuit 30b is connected to a node n80. The terminal TPRG and an inverting terminal TPARG1 are connected to the AND circuit 30b.

Figures 9, 10:
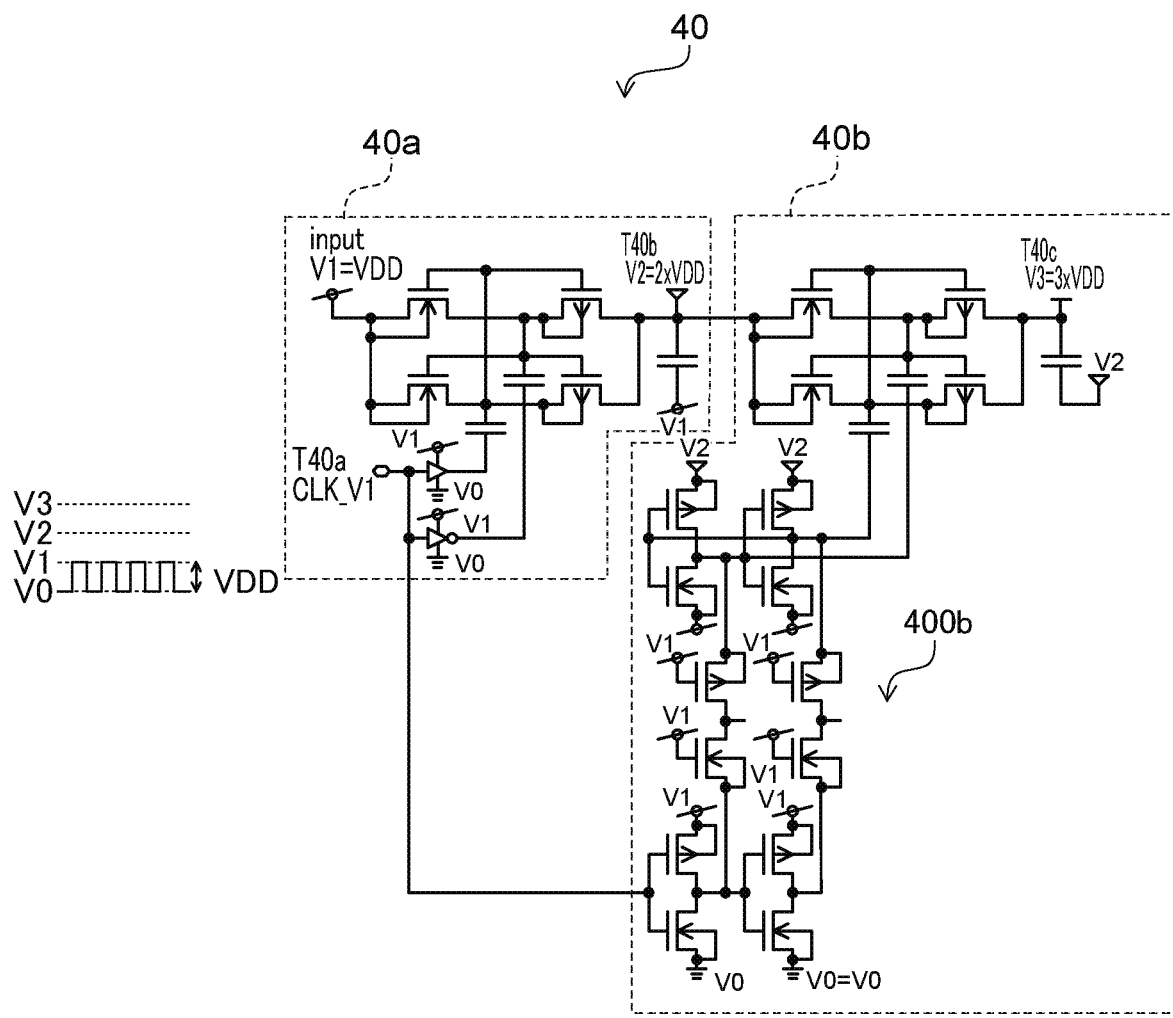
FIG. 9 is a diagram illustrating truth values of the second voltage generation circuit.
FIG. 10 is a diagram illustrating a detailed configuration example of a power supply circuit.

FIG. 9 is a truth table of the second voltage generation circuit 30. PRGmode represents a voltage to be applied to the terminal TPRG, and PARG1 represents a voltage to be applied to the inverting terminal TPARG1. Further, the voltage of an output terminal TPRG2_X of the level shifter circuit 30a is represented by PRG2_X. In a case where the voltage PRGmode is VDD and the voltage PARG1 is VDD, the output of the level shifter circuit 30a is 0 V, and the voltage PRG2_X is VDD. Meanwhile, in a case where the voltage PRGmode is VDD and the voltage PARG1 is 0 V, the output of the level shifter circuit 30a is VDD, and the voltage PRG2_X is 2×VDD. Further, in a case where the voltage PRGmode is 0 V and the voltage PARG1 is 0 V, the output of the level shifter circuit 30a is 0 V, and the voltage PRG2_X is VDD. In this manner, the second voltage generation circuit 30 can apply 2×VDD or VDD to the terminal T1 in FIG. 2.

FIG. 10 is a diagram illustrating a detailed configuration example of the power supply circuit 40. The power supply circuit 40 includes a first booster circuit 40a and a second booster circuit 40b. That is, the first booster circuit 40a is an identical circuit to a general booster circuit (for example, cross-coupled switched capacitor type voltage doubler circuit). The first booster circuit 40a amplifies a clock signal CLK_V1 with an amplitude of VDD input to an input terminal T40a, and outputs 2×VDD from an output terminal T40b. The second booster circuit 40b is different from the first booster circuit 40a in that an input portion of the first booster circuit 40a is configured by a level shifter circuit 400b. That is, an input clock of the second booster circuit 40b has an amplitude of 2×VDD, and the second booster circuit 40b outputs 3×VDD from an output terminal T40c. In this manner, the power supply circuit 40 can stably supply a voltage, 2×VDD, and 3×VDD to the first voltage generation circuit 20 and the second voltage generation circuit 30.

As described above, according to the present embodiment, in a case where a write voltage that breaks a gate oxide film is applied to the terminal T0 of the antifuse element MP0 and the gate oxide film is not broken, the potential PRG2_X that makes a potential difference between the terminal T0 and the node N1 less than a potential that breaks the gate oxide film is applied to a gate of the transistor MN3 connected to the node N1 that is the other end of the antifuse element MP0. Accordingly, when writing is not performed for the antifuse element MP0, the gate oxide film is prevented from being broken, a potential difference between the voltage PRG2_X and the reference potential V0 can be divided by the transistors MN0, MN3, and MN1, and the breakdown voltage of each of the transistors MN0, MN3, and MN1 can be made lower. Further, even when a high voltage because of coupling that can be applied is applied when writing is not performed for the antifuse element MP0, that high voltage can be divided by the transistors MN0 and MN3, so that the breakdown voltage of each of the transistors MN0 and MN3 can be made lower.

Second Embodiment

In the semiconductor storage device 1 according to the first embodiment, a voltage of the node N1 is controlled by a gate voltage of the transistor MN3. Meanwhile, a semiconductor storage device 2 according to a second embodiment is different from the semiconductor storage device 1 in that the voltage of the node N1 is controlled by a level shifter circuit L/S. In the following descriptions, different points from the first embodiment are explained. In the semiconductor storage device 1 according to the second embodiment, the second voltage generation circuit 30 may be included in the antifuse memory circuit 10.

Figure 11:
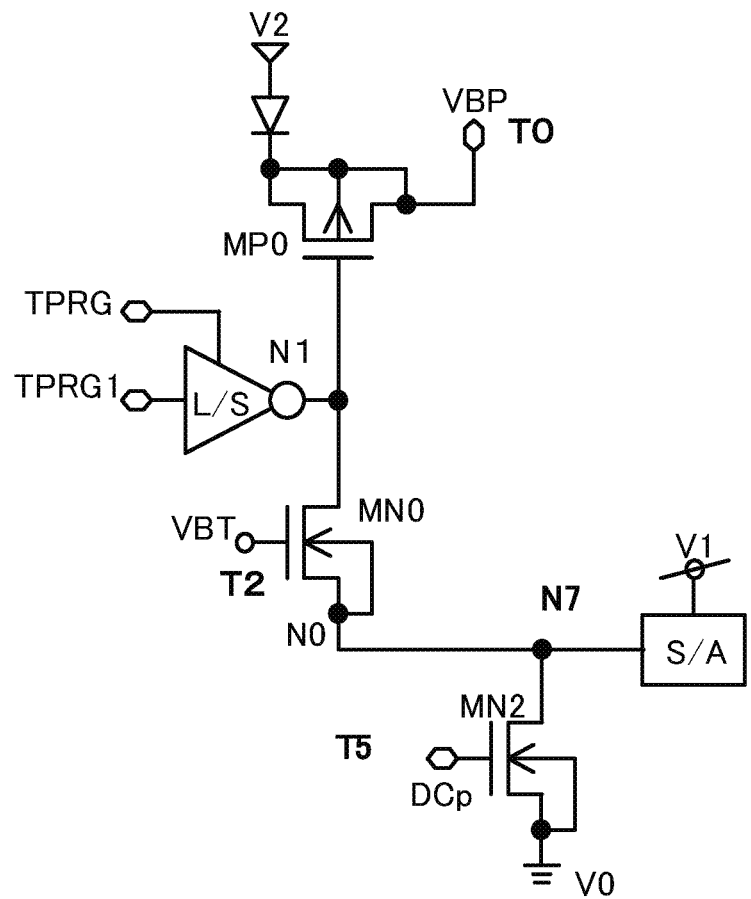
FIG. 11 is a diagram illustrating a configuration example of an antifuse memory circuit according to a second embodiment.

FIG. 11 is a diagram illustrating a configuration example of the antifuse memory circuit 10 according to the second embodiment. FIG. 12 is a table representing a relation between a voltage applied to the antifuse memory circuit 10 according to the second embodiment and each mode.

The antifuse memory circuit 10 according to the second embodiment includes, for example, the antifuse element MP0, the level shifter circuit L/S, the transistors MN0 and MN2, and the sense amplifier S/A. As illustrated in FIG. 11, the transistors MN0 and MN2 are connected in series to each other between the node N1 and the reference potential V0. The level shifter circuit L/S is connected to the node N1.

PRGmode in FIG. 12 represents a voltage to be applied to the terminal TPRG, and PRG1 represents a voltage to be applied to a terminal TPRG1.

First, in cell writing in a program state of the antifuse memory circuit 10, the voltage VBP applied to the terminal T0 is 3×VDD, and the voltages PRGmode, PRG1, VGT, and DCp respectively applied to the terminals TPRG, TPRG1, T2, and T5 are VDD. Thus, the transistors MN0 and MN2 become a conductive state. Accordingly, a potential difference between the terminal T0 and the node N1 becomes 3×VDD, so that a gate oxide film of the antifuse element MP0 is broken. Consequently, gate, source, drain, and back gate of the antifuse element MP0 become a conductive state with each other.

As described above, in order not to break the gate oxide film of the antifuse element MP0, it is necessary to suppress the voltage between the terminal T0 and the node N1 within VDD+threshold voltage Vth, for example. Therefore, in the present embodiment, a voltage of 2×VDD is applied to the node N1 from the level shifter circuit L/S when writing is not performed.

Accordingly, the gate oxide film of the antifuse element MP0 is prevented from being broken.

FIG. 13 is a truth table of the level shifter circuit L/S. LSout represents an output voltage of the level shifter circuit L/S that is applied to the node N1. When the voltages PRGmode and PRG1 are each VDD, the voltage LSout becomes 0 V. Further, when the voltages PRGmode and PRG1 are VDD and 0 V, respectively, the voltage LSout becomes 2×VDD. Furthermore, when the voltages PRGmode and PRG1 are 0 V and VDD, respectively, the voltage LSout becomes floating and has a value between 0 to VDD.

Figure 14:
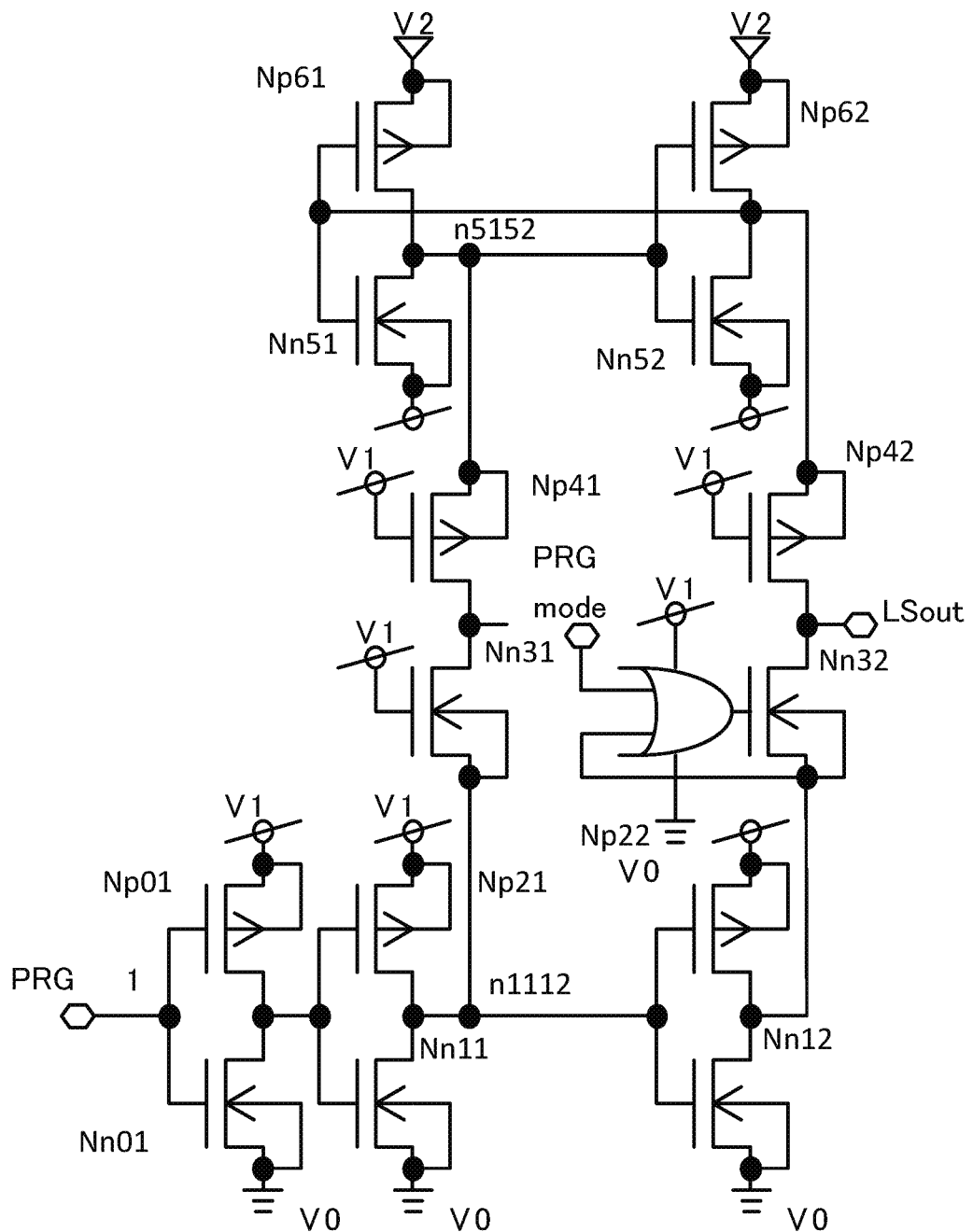
FIG. 14 is a diagram illustrating a configuration example of the level shifter circuit.

FIG. 14 is a diagram illustrating a configuration example of the level shifter circuit L/S. The level shifter circuit L/S is identical to the level shifter circuit 20a illustrated in FIG. 5 in its basic configuration, but is different from the level shifter circuit 20a in that an OR circuit is connected to a gate of the transistor Nn32 and transistors Np01 and Nn01 further connected in series to each other are connected to a connecting point between gates of the transistors Np21 and Nn11.

With this configuration, the level shifter circuit L/S operates in an identical manner to the level shifter circuit 20a, when the voltage VDD is applied to the terminal TPRG. However, because the transistor Np01 and the transistor Nn01 are connected to each other, the level shifter circuit L/S outputs 2×VDD when the voltage PRG1 is 0 V, and outputs 0 V when the voltage PRG1 is VDD.

Figure 15:
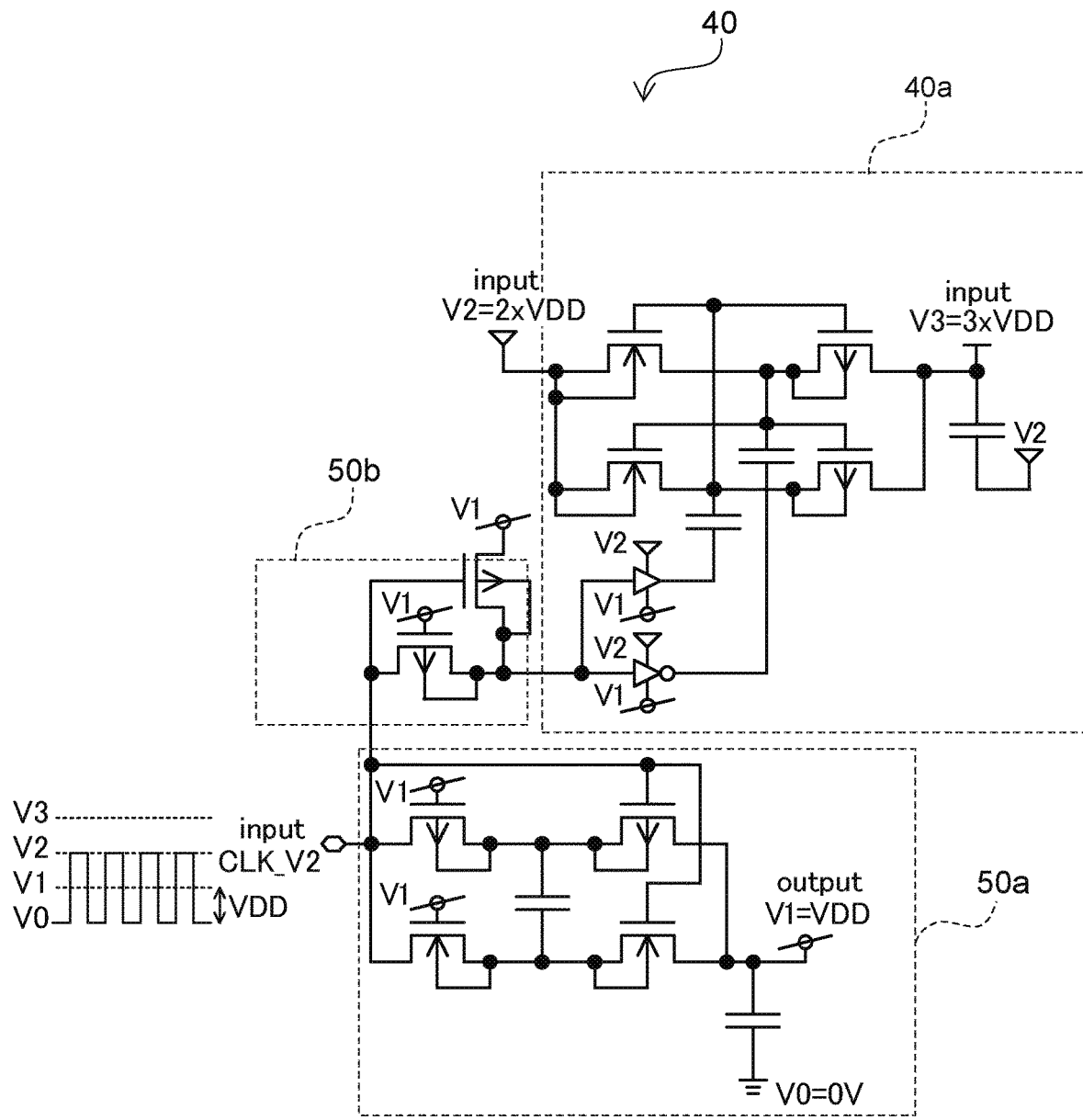
FIG. 15 is a diagram illustrating a configuration example of a power supply circuit according to the second embodiment.

FIG. 15 is a diagram illustrating a configuration example of the power supply circuit 40 according to the second embodiment.

The power supply circuit 40 according to the second embodiment includes a step-down circuit 50a, a level-down circuit 50b, and the booster circuit 40a. The step-down circuit 50a steps down an input clock signal CLK_V2 with an amplitude of V2 and outputs the voltage V1 (see Patent Literature 2). The booster circuit 40a has an equivalent configuration to the booster circuit 40a illustrated in FIG. 10. The level-down circuit 50b is configured by two PMOS transistors, for example. A gate of a second NMOS transistor is connected to one end of a first PMOS transistor, the voltage V1 is applied to a source of the second NMOS transistor, and a drain is connected to the other end of the first PMOS transistor. With this configuration, the voltage V3 and the voltage V1 are supplied to the first voltage generation circuit 20. The power supply circuit 40 according to the second embodiment can be also used as a power supply circuit of the first embodiment. Meanwhile, the power supply circuit 40 according to the first embodiment can be also used as a power supply circuit of the second embodiment.

FIG. 16 is a truth table of a level-down circuit configured by a PMOS transistor. FIG. 17 is a diagram illustrating a configuration example and an operation example of the level-down circuit configured by a PMOS transistor. The level-down circuit outputs 2×VDD when 2×VDD is input thereto, and outputs VDD when 0 V is applied thereto.

FIG. 18 is a truth table of a level-down circuit configured by an NMOS transistor. FIG. 19 is a diagram illustrating a configuration example and an operation example of the level-down circuit configured by an NMOS transistor. The level-down circuit illustrated in FIG. 19 is configured by two NMOS transistors, for example. A gate of a second NMOS transistor is connected to one end of a first NMOS transistor, the voltage V1 is applied to a source of the second NMOS transistor, and a drain is connected to the other end of the first NMOS transistor. The level-down circuit outputs VDD when 2×VDD is input thereto, and outputs 0 V when 0 V is applied thereto.

As described above, according to the present embodiment, in a case where a write voltage that breaks a gate oxide film is applied to the terminal T0 of the antifuse element MP0 and the gate oxide film is not broken, the level shifter circuit L/S connected to the node N1 that is the other end of the antifuse element MP0 applies a potential of 2×VDD that makes a potential difference between the terminal T0 and the node N1 less than a potential that breaks the gate oxide film. Accordingly, when writing is not performed for the antifuse element MP0, the gate oxide film is prevented from being broken, the voltage PRG2_X and the reference potential V0 can be divided by the transistors MN0 and MN2, and the breakdown voltage of each of the transistors MN0 and MN2 can be made lower. Further, because a voltage is applied by the level shifter circuit L/S, it is possible to apply a target voltage to the node N1 irrespective of a circuit configuration from the node N1 to the reference potential V0.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
an antifuse element connected at one end to a first terminal to which a write voltage is applicable, and including a gate oxide film;
a first element connected to the other end of the antifuse element, wherein the first element is a first transistor connected at one end to the other end of the antifuse element
a second transistor connected at one end to the other end of the first transistor; and
a third transistor connected at one end to the other end of the second transistor and having the other end to which a reference potential is supplied,
wherein film thicknesses of gate oxide films of the antifuse element, the first transistor, the second transistor, and the third transistor are about equal, and
in a case where the write voltage that breaks the gate oxide film of the antifuse element is applied to the first terminal and the gate oxide film of the antifuse element is not broken, a potential that makes a potential difference between the first terminal and the other end of the antifuse element less than a potential that breaks the gate oxide film of the antifuse element is applied to a gate of the first transistor.

2. The device of claim 1, wherein back gates of the first and second transistors are open, and
in a case where the gate oxide film is not broken, a voltage between the other end of the antifuse element and the one end of the third transistor is divided by the first transistor and the second transistor.

3. The device of claim 1, wherein the first transistor and the second transistor are MOS transistors.

4. The device of claim 1, wherein in a case where the gate oxide film is not broken, a gate voltage that makes the other end of the antifuse element have the second potential is applied to a gate of the first transistor.

5. The device of claim 4, further comprising a first voltage generation circuit capable of supplying the write voltage to the first terminal.

6. The device of claim 5, wherein the first voltage generation circuit includes a plurality of level shifter circuits.

7. The device of claim 5, further comprising a second voltage generation circuit configured to generate the gate voltage.

8. The device of claim 7, further comprising a power supply circuit capable of supplying a voltage to the first voltage generation circuit and the second voltage generation circuit.

9. A semiconductor storage device comprising:
an antifuse element connected at one end to a first terminal to which a write voltage is applicable, and including a gate oxide film;
a first element connected to the other end of the antifuse element, wherein the first element is a level shifter circuit;
a fourth transistor connected at one end to the other end of the antifuse element and
a fifth transistor connected at one end to the other end of the fourth transistor and having the other end to which a reference potential is supplied,
wherein film thicknesses of gate oxide films of the antifuse element, the fourth, and the fifth transistor are about equal, and
in a case where the write voltage that breaks the gate oxide film of the antifuse element is applied to the first terminal and the gate oxide film of the antifuse element is not broken, the level shifter circuit supplies the second potential that makes a potential difference between the first terminal and the other end of the antifuse element less than a potential that breaks the gate oxide film of the antifuse element.

10. A control method of a semiconductor storage device including an antifuse element that is connected at one end to a first terminal to which a write voltage is applicable and that has a gate oxide film,
a first element connected to the other end of the antifuse element, wherein the first element is a first transistor connected at one end to the other end of the antifuse element;
a second transistor connected at one end to the other end of the first transistor; and
a third transistor connected at one end to the other end of the second transistor and having the other end to which a reference potential is supplied,
wherein film thicknesses of gate oxide films of the antifuse element, the first transistor, the second transistor, and the third transistor are about equal, the method comprising,
in a case where the write voltage that breaks the gate oxide film is applied to the first terminal and the gate oxide film is not broken,
dividing a voltage between the other end of the antifuse element and the other end of the third transistor by the first transistor, the second transistor, and the third transistor, and
controlling the first element to supply a second potential that makes a potential difference between the one end and the other end of the antifuse element less than a potential that breaks the gate oxide film of the antifuse element, to the other end.

11. The method of claim 10, wherein back gates of the first and second transistors are open, and
in a case where the gate oxide film is not broken, a voltage between the other end of the antifuse element and the one end of the third transistor is divided by the first transistor and the second transistor.

12. The method of claim 11, wherein the first transistor and the second transistor are MOS transistors.

13. The method of claim 11, wherein in a case where the gate oxide film is not broken, a gate voltage that makes the other end of the antifuse element have the second potential is applied to a gate of the first transistor.

14. The method of claim 13, wherein a first voltage generation circuit of the semiconductor storage device is capable of supplying the write voltage to the first terminal.

15. The method of claim 14, wherein the first voltage generation circuit includes a plurality of level shifter circuits.

16. The method of claim 15, wherein a second voltage generation circuit of the semiconductor storage device generates the gate voltage.

17. The method of claim 16, wherein a power supply circuit of the semiconductor storage device is capable of supplying a voltage to the first voltage generation circuit and the second voltage generation circuit.

* * * * *